US006374635B1

(12) United States Patent
Hayakawa et al.

(10) Patent No.: US 6,374,635 B1
(45) Date of Patent: Apr. 23, 2002

(54) PFC GAS RECOVERY PROCESS AND APPARATUS

(75) Inventors: Junichi Hayakawa; Tetsuo Komai; Yoichi Mori, all of Kanagawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/582,659

(22) PCT Filed: Oct. 27, 1999

(86) PCT No.: PCT/JP99/05937

§ 371 Date: Aug. 17, 2000

§ 102(e) Date: Aug. 17, 2000

(87) PCT Pub. No.: WO00/26592

PCT Pub. Date: May 11, 2000

(30) Foreign Application Priority Data

Oct. 29, 1998 (JP) ............................................. 10-309195

(51) Int. Cl.[7] .................................................. F25J 1/00
(52) U.S. Cl. ............................................ 62/637; 62/269
(58) Field of Search .......................... 62/637, 638, 268, 62/269

(56) References Cited

U.S. PATENT DOCUMENTS 4,755,201 A * 7/1988 Eschway et al. ............... 62/637
5,533,338 A * 7/1996 Lee et al. ....................... 62/638
5,799,509 A * 9/1998 Finley et al. ................... 62/638

OTHER PUBLICATIONS

Text handed out in a seminar entitled "Environmental Issues and Cost Problems Confronting Semiconductor Plants (cost reductions to fight for the survival of 64M Shrink, ver/ 256MDRAM)" held on Jun. 25, 1998 at Yurakucho Asahi Square, Tokyo, Japan (w/English translation (1) of cover page; (2) Article 4–3—"Emissions from the Etching Process and Measures in Response" by Mr. Masato Fujino, Toshiba Corporation; (3) Article 4–6—"Collection and Reproduction of PFC (Perfluoro Compound)" by Mr. Makoto Nagashima, Daido Air Products Electronics, Inc.; and (4) last two pages showing details of the seminar).

* cited by examiner

Primary Examiner—Ronald Capossela
(74) Attorney, Agent, or Firm—Armstrong, Westerman & Hattori, LLP

(57) ABSTRACT

The present invention aims to provide a process and an apparatus for recovering a PFC gas, which can readily bring cooling traps to a cryogenic temperature with a low-capacity refrigerator and can recover a high-purity PFC gas by applying deep freeze separation without the need for a multistage fractionator. To achieve this object, the present invention relates to an apparatus for recovering a PFC gas from a mixed gas containing the PFC gas discharged from a vacuum processing chamber (etching chamber), comprising a cooling trap connected to the exhaust system of the vacuum processing chamber and adapted to freeze and collect a mixed gas discharged from said vacuum processing chamber, a non-PFC gas removal system for removing gases other than the PFC gas from the regenerated mixed gas emitted by vaporization of said frozen and collected gas after the operation of said cooling trap is stopped, and a recovery means for recovering a high-concentration PFC gas freed of gases other than the PFC gas in said non-PFC gas removal system, as well as a process therefor.

6 Claims, 10 Drawing Sheets

FIG. 3

| Gas component | Gas flow rate (sccm), (% conc) | | Trap efficiency(%) |
|---|---|---|---|
| | Point A | Point B | |
| CF4(PFC) | 60, (36) | 3, ( 7) | 95 |
| CO | 10, ( 6) | 9.6, (20) | 4 |
| CO2 | 53, (31) | 8, (20) | 85 |
| SiF4 | 5, ( 3) | 0.5, ( 1) | 90 |
| F2 | 15.4, ( 9) | 14, (35) | 10 |
| HF | 20, (12) | 0.4, ( 1) | 98 |
| O2 | 5, ( 3) | 4.9, (12) | 3 |

| Flow rate at point C (sccm), (% conc) |
|---|
| 3, (166) |
| 1.6, (532) |
| 0, (0) |
| 0, (0) |
| 0, (0) |
| 0, (0) |
| 4.9, (272) |
| Diluting N2 flow rate |

FIG. 4

| Gas component | Trapped gas volume (ml) Point D | Gas volume after removal system 19 (ml) Point E |
|---|---|---|
| CF4(PPC) | 2700 | 2700 |
| CO | 20 | 0 |
| CO2 | 2100 | 0 |
| SiF4 | 216 | 0 |
| F2 | 67 | 0 |
| HF | 940 | 0 |
| O2 | 5 | 0 |

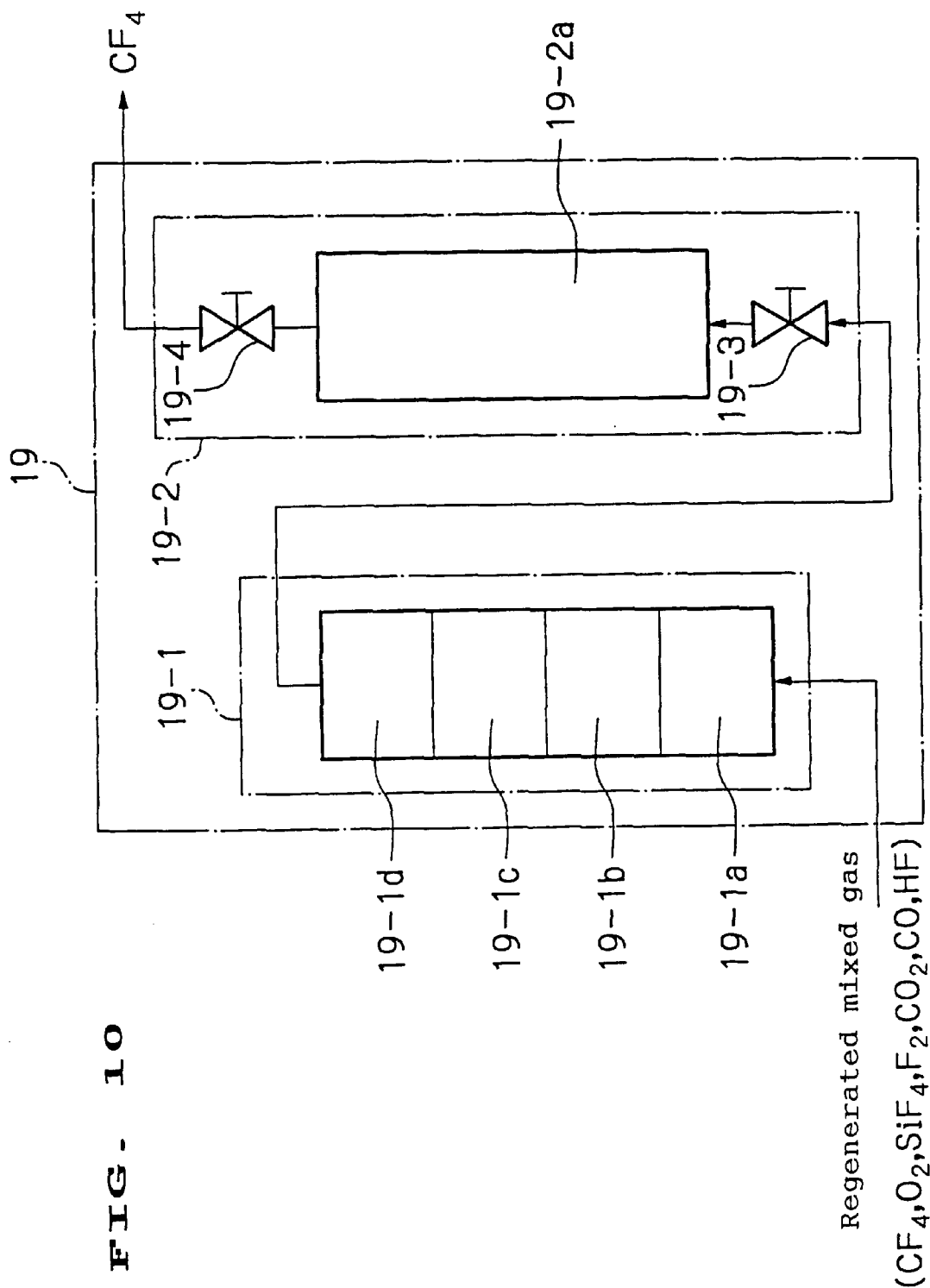

PFC GAS RECOVERY PROCESS AND APPARATUS

FIELD OF THE INVENTION

The present invention relates to a process and an apparatus for recovering a PFC gas used in semiconductor manufacturing processes such as an etching process.

PRIOR ART

Certain perfluorinated compounds and fluorohydrocarbon compounds used in semiconductor manufacturing processes, such as etching processes, contribute to the so-called greenhouse effect and remain in a stable state for a long periods, namely several to hundreds of times longer than that of carbon dioxide. Therefore, these remain undecomposed for a long period, and their contribution to warming is thousands to tens of thousands times higher than that of carbon dioxide. Gases which contribute considerably to a greenhouse effect include $CF_4$, $C_2F_6$, $C_3F_8$, $C_2F_4$, $CHF_3$, $C_4F_8$, $NF_3$, etc., which are generally referred to as PFC (perfluoro compound) gases and pressure has been mounting for control of the emission thereof. At the Kyoto COP3 (Conference on United Nations Framework Convention on Climate Change) held in Kyoto in December 1997, a motion was passed for control of greenhouse effect gas emissions including a 6% reduction in carbon dioxide and other gases to below 1990 levels by 2010, and a 6% reduction of PFC, HFC, $SF_6$ to below 1995 levels by 2010.

PFC gases used in semiconductor manufacturing processes have a comparatively limited influence on global warming, that is, greenhouse effect at present since the rate of emission thereof, is far lower than that of $CO_2$. However, as noted, such PFC gases have a long life in the atmosphere to result in a high global warming factor for 100 years. Thus, the following approaches have been proposed to reduce the emission of PFC gases.

These approaches include optimizing processes by using a circulation cycle or the like to reduce the amount of PFC gases used, recovering PFC gases to recycle them, seeking alternative gases and developing the corresponding processes, or disposal after decomposition and detoxification.

Among them, the method of recovering PFC gases to recycle them uses membrane separation, adsorption separation or deep freeze separation. Membrane separation relies on differences in permeation rates at which gaseous molecules pass through a membrane, and simultaneously accomplishes recovery and concentration by providing an apparatus for recovering and concentrating a PFC gas following use of an apparatus for removing non-PFC gases. Adsorption separation relies on differences in adsorption performance depending on the pressure at which gases are adsorbed to an adsorbent. Deep freeze separation relies on differences in vaporization curves of gases, i.e., differences in the boiling points of gases, as shown in FIG. 1, to selectively separate a target PFC gas by collecting said PFC gas in a trap at a temperature slightly lower than the boiling point of said PFC gas and raising the trap temperature to a temperature slightly higher than the boiling point of said PFC gas.

However, membrane separation involves the following disadvantages.

1) Gas under high pressure needs to be supplied to the membrane, and thus a vacuum cannot be used.

2) membrane recovery can not effect recovery and condensation of a small flow of PFC gas as used in etching or the like. That is, the PFC gas to be concentrated escapes to a permeation side of impure gases. Particularly when the concentration of the PFC gas on the feeding side is high, a larger part of the PFC gas permeates. Thus, the concentration of the PFC gas should be lowered by means of some other gas ($N_2$ or the like) to ensure an adequate flow rate.

3) The concentration of the PFC gas concentrate or the concentration of impurities varies with the concentration or flow rate of the feed PFC gas, $O_2$ or $N_2$. Some means for controlling variation such as a backup tank is required.

4) The gas supplied to the membrane should be pretreated to remove acid gases, or the membrane will degrade. This pretreatment incurs additional costs.

5) These conditions need a powerful and large compressor or a large buffer container or the like, which leads to a large-scale equipment occupying a large installation space.

Deep freeze separation also involves the following disadvantages.

1) Only a PFC gas cannot be condensed and vaporized from a mixture of a plurality of gases, but some other gases of the mixed gas are included. Therefore, a multistage separation and regeneration system is required for a concentration similarly to fractional distillation of gases or liquids, which also requires large-scale equipment.

2) A powerful refrigerator and a large fractionator are required because the multistage fractionator can not be provided in a vacuum piping for the lack of space but must be run under atmospheric conditions on the outlet side of a vacuum pump.

3) Concentration to some extent and a fair amount of gas are needed at the previous stage.

In view of the above, the present invention aims to provide a process and an apparatus for recovering a PFC gas, which can readily bring cooling traps to a cryogenic temperature with a low-capacity refrigerator and can recover a high-purity PFC gas by applying deep freeze separation without the need for using a multistage fractionator.

SUMMARY OF THE INVENTION

The invention of claim 1 relates to a process for recovering a PFC gas, comprising freezing and collecting a determined amount of a mixed gas containing the PFC gas discharged from a vacuum processing chamber in a cooling trap, then stopping the operation of said cooling trap and passing the regenerated mixed gas emitted by vaporization of said frozen and collected gas through a non-PFC gas removal system to remove gases other than the PFC gas from said regenerated mixed gas and provide a high-concentration of PFC gas, and recovering said high-concentration PFC gas.

When deep freeze separation is used to freeze and collect a mixed gas containing a PFC gas discharged from a vacuum processing chamber in a cooling trap at or below the temperature which allows the target PFC gas to be trapped as defined above, 100% of the PFC gas can be condensed in principle. On the contrary, membrane separation is not useful for efficiently recovering a PFC gas because the PFC gas to be concentrated escapes during concentration.

The invention of claim 2 relates to an apparatus for recovering a PFC gas from a mixed gas containing the PFC gas discharged from a vacuum processing chamber, comprising a cooling trap connected to the exhaust system of the vacuum processing chamber and adapted to freeze and collect the mixed gas discharged from said vacuum processing chamber, a non-PFC gas removal system for removing gases other than the PFC gas from the regenerated mixed gas emitted by vaporization of said frozen and collected gas after the operation of said cooling trap is stopped, and a recovery means for recovering a high-concentration PFC gas freed of gases other than the PFC gas in said non-PFC gas removal system.

When the cooling trap is connected to the exhaust system of the vacuum processing chamber, i.e. when the cooling trap is provided on the vacuum side as defined above, a small size, low-capacity refrigerator suffices to easily attain a cryogenic temperature. Moreover, a high-concentration PFC gas can be obtained because the non-PFC gas removal system removes gases other than PFC gases ($SiF_4$, $CO_2$, HF, $F_2$ or the like herein referred to as non-PFC gases) from the mixed gas emitted by vaporization of the frozen and collected gas after the operation of the cooling trap is stopped.

The invention of claim 3 relates to the apparatus for recovering a PFC gas according to claim 2, which comprises a first circulation loop for supplying the high-concentration PFC gas discharged from the non-PFC gas removal system to the recovery means and returning a part of the high-concentration PFC gas to the cooling trap, whereby a part of said high-concentration PFC gas is supplied to the cooling trap via said first circulation loop.

When a first circulation loop is provided as defined above to send the high-concentration PFC gas discharged from the non-PFC gas removal system to the cooling trap via the first circulation loop while supplying said high-concentration PFC gas to the recovery means, the regenerated mixed gas in the cooling trap can be rapidly sent over the high-concentration PFC gas to the non-PFC gas removal system.

The invention of claim 4 relates to the apparatus for recovering a PFC gas according to claim 3, which comprises a second circulation loop for returning a part of the high-concentration PFC gas discharged from the non-PFC gas removal system to the inlet side of the non-PFC gas removal system to constantly send the high-concentration gas to said non-PFC gas removal system via said second circulation loop.

When a second circulation loop is provided as defined above to constantly send the high-concentration gas to the non-PFC gas removal system via said second circulation loop, entrapment can be prevented.

The invention of claim 5 relates to the apparatus according to claim 2, which comprises a vacuum pump provided on the inlet side of the non-PFC gas removal system. When a vacuum pump is provided on the inlet side of the non-PFC gas removal system to reduce pressure on the side of the non-PFC gas removal system as defined above, regeneration in the cooling trap can be performed under reduced pressure. Thus, the regeneration temperature of the cooling trap can be lowered to prevent inclusion of water vapor in the regenerated gas and to save the energy required to return the cooling trap to the cooling trap temperature after completion of regeneration.

The invention of claim 6 relates to the apparatus according to claim 5, which comprises a circulation loop for supplying a part of the high-concentration PFC gas discharged from the non-PFC gas removal system as a gas for oil diffusion prevention and dilution to the vacuum pump. The invention of claim 7 relates to the apparatus according to claims 5 or 6, which comprises a first circulation loop for supplying the high-concentration PFC gas discharged from the non-PFC gas removal system to the recovery means and returning a part thereof to the cooling trap, whereby a part of said high-concentration PFC gas is supplied to the cooling trap via said first circulation loop.

The invention of claim 8 relates to the apparatus for recovering a PFC gas according to any one of claims 2 to 7, which comprises two cooling traps wherein a mixed gas containing the PFC gas discharged from the vacuum processing chamber is frozen and collected at one cooling trap while the operation of the other cooling trap is stopped to recover the PFC gas from the regenerated mixed gas emitted by vaporization of the frozen and collected gas.

When two cooling traps are provided and a mixed gas containing a PFC gas discharged from the vacuum processing chamber is frozen and collected at one cooling trap while the cooling operation of the other cooling trap is stopped to recover the PFC gas from the regenerated mixed gas emitted by vaporization of the frozen and collected gas as defined above, continuous processing can be achieved without any interruption in the vacuum processing chamber even when the collecting ability of one cooling trap is lowered and is required to be regenerated, since the other cooling trap serves as a cooling side to freeze and collect the mixed gas discharged from the vacuum processing chamber.

The present invention will now be described by way of examples with reference to the attached drawings. The following examples illustrate a process and an apparatuses for recovering a PFC gas discharged from an etching chamber during a semiconductor manufacturing process. The examples described below and shown in the drawings illustrate the embodiment comprising two cooling traps for parallel operation as defined in claim 8.

BRIEF DESCRIPTION OF THE DRAWINGS

FIG. 3 shows the emission gas levels measured at points A, B and C of the PFC gas recovery apparatus of FIG. 2 and trap efficiencies.

FIG. 4 shows the gas flow levels measured at points D and E of the PFC gas recovery apparatus of FIG. 2.

FIG. 10 shows an arrangement of a non-PFC gas removal system suitable for use in the present invention.

PREFERRED EMBODIMENTS OF THE INVENTION

Figure 2:
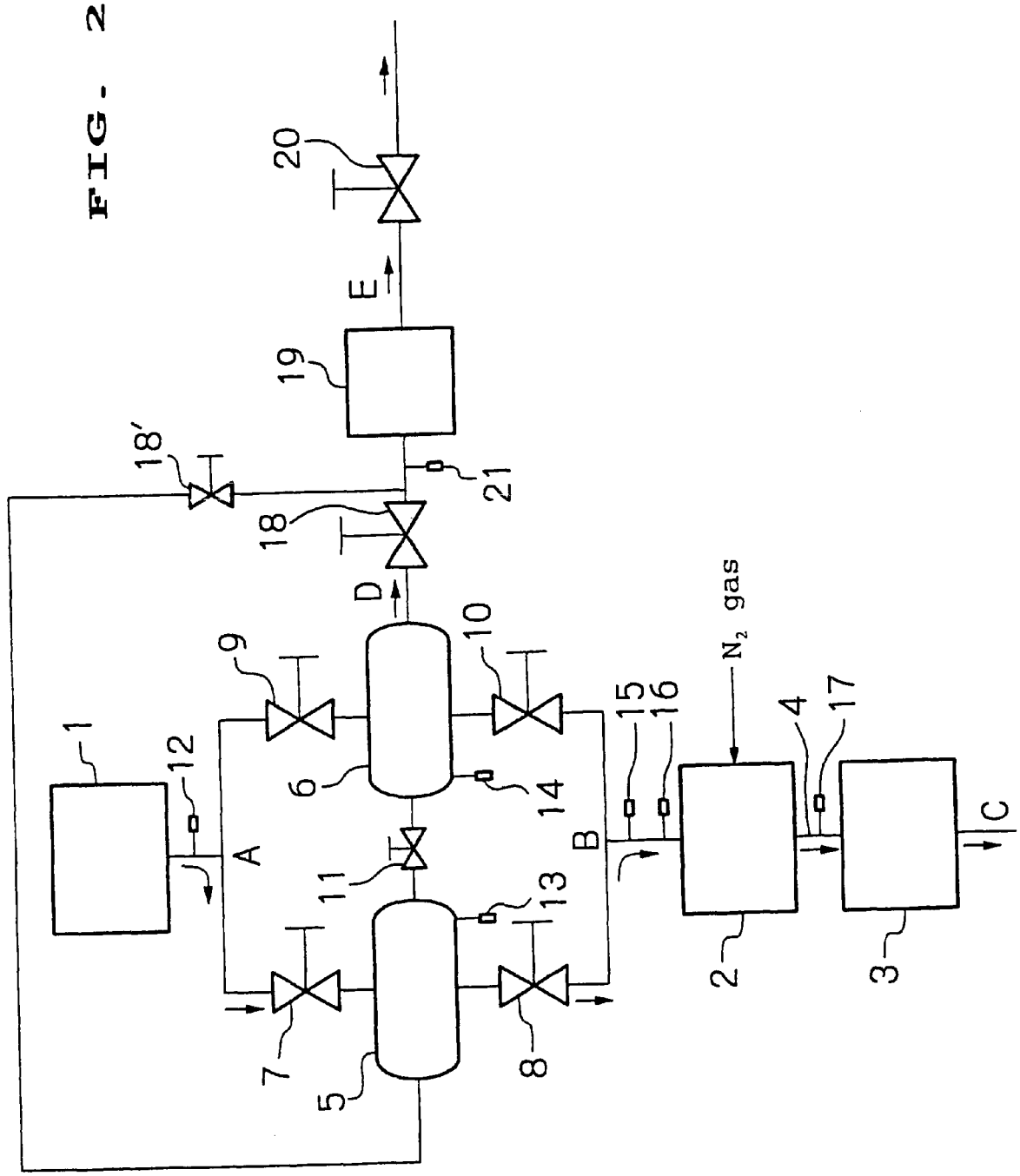
FIG. 2 shows an arrangement of a PFC gas recovery apparatus according to one embodiment of the present invention.

FIG. 2 shows an arrangement of a PFC gas recovery apparatus according to one embodiment of the present invention.

In FIG. 2, reference numeral 1 represents an etching chamber in which is provided an exhaust system comprising a dry pump 2 and a toxic gas removal system 3 connected to each other via a piping 4. Between etching chamber 1 and dry pump 2 are connected two cooling traps 5 and 6 in parallel via switching valves 7, 8 and switching valves 9, 10, and cooling traps 5 and 6 are connected via switching valve 11.

The following elements are also shown: a pressure sensor 12 for detecting the pressure at the outlet of the etching chamber; a pressure sensor 13 for detecting the internal pressure in cooling trap 5; a pressure sensor 14 for detecting the internal pressure in cooling trap 6; a halogen detector 15 provided in piping 5 on the inlet side of dry pump 2; a pressure sensor 16; a halogen detector 17 provided in piping 4 on the discharge side of dry pump 2; a switching valve 18; a non-PFC gas removal system 19; a switching valve 20; and a pressure sensor 21.

In the PFC gas recovery apparatus having the above structure, one of the two cooling traps 5, 6 is operated as a cooling side to freeze and collect a mixed gas containing a PFC gas discharged from etching chamber 1, while the operation of the other cooling trap is stopped as a regeneration side to remove gases other than the PFC gas (non-PFC gases) from the regenerated mixed gas emitted by vaporization of the mixed gas frozen and collected at said one cooling trap and recover the PFC gas. In the operation described below, cooling trap 5 is operated as a cooling side to freeze and collect a mixed gas while cooling trap 6 is out of operation as a regeneration side to recover a PFC gas.

Cooling trap 5 serving as a cooling side is preliminarily operated at a predetermined constant low temperature, and switching valves 7 and 8 are opened while switching valves 9, 10 and 11 are closed. A refrigerator not shown of cooling trap 6 serving as a regeneration side is stopped to raise the temperature of cooling trap 6. Switching valve 18 is connected to cooling trap 6 on a regeneration side out of operation. Switching valve 18' connected to cooling trap 5 in cooling operation is closed.

A mixed gas containing a PFC gas discharged from etching chamber 1 passes through switching valve 7 to cooling trap 5 on a cooling side where it is collected and frozen. Exhaust gas having passed cooling trap 5 passes through dry pump 2 to a toxic gas removal system 3 from which it is discharged. Exhaust gas passing through dry pump 2 is reduced by nitrogen ($N_2$) gas introduced for the purpose of preventing diffusion of lubricating oils and diluting reactive gases in said dry pump 2. Hazardous reactive gases are removed at toxic gas removal system 3.

The limit at which cooling trap 5 can collect (trap) a mixed gas is determined by the outputs of halogen detectors 15 and 17, a temperature sensor not shown in cooling trap 5, pressure sensor 12 and pressure sensor 16. Namely, the limit of the cooling trap is determined by output changes of halogen detector 15 or 17, temperature rise in cooling trap 5, pressure rise or pressure differences between inlet and outlet sides of cooling trap 5 when no more PFC gas can be collected.

When a PFC gas is to be recovered from the frozen and collected mixed gas collected at cooling trap 6 on a regeneration side, switching valve 7 on the inlet side and switching valve 8 on the outlet side of cooling trap 5 for next operation are opened to prevent the mixed gas flowing from etching chamber 1 from stopping before switching valve 9 on the inlet side and switching valve 10 on the outlet side of cooling trap 6 are closed. Then, switching valves 9 and 10 are closed. At this instant, switching valves 11 and 18 have already been closed.

When the operation of the refrigerator not shown of cooling trap 6 is stopped, the temperature of cooling trap 6 begins to rise. The pressure differs between the sides of cooling trap 6 and non-PFC gas removal system 19 separated by switching valve 18, and the pressure on the side of cooling trap 6 is negative. In order to prevent backflow of gas from non-PFC gas removal system 19, the pressure on the side of cooling trap 6 needs to be raised. Thus, the temperature of cooling trap 6 is first raised. As the temperature of cooling trap 6 rises, the mixed gas frozen and collected at said cooling trap 6 vaporizes and the pressure on the side of cooling trap 6 gradually increases.

Once the pressure on the side of cooling trap 6 becomes equal to or higher than that on the side of non-PFC gas removal system 19, switching valve 18 is opened. The pressure condition is determined from the outputs of pressure sensors 14 and 21. A temperature rise of cooling trap 6 may be accomplished without temperature control by completely stopping the operation of a cooling means such as a refrigerator, or may be accomplished under temperature control by regulating a temperature rise or maintaining an appropriate temperature via a heater and a cooling means such as a refrigerator on cooling trap 6.

The regenerated mixed gas containing a PFC gas emitted by vaporization of the frozen and collected mixed gas in cooling trap 6 enters non-PFC gas removal system 19, where it is freed of non-PFC gases and discharged as a highly-pure PFC gas. The regeneration state resulting from vaporization of the frozen and collected mixed gas is monitored from the outputs of pressure sensors 14 and 21 and a temperature sensor not shown in cooling trap 6.

Once regeneration of the mixed gas is terminated, cooling trap 6 is prepared for cooling. This cooling may be carried out either after the pressure in cooling trap 6 is lowered or immediately, without any reduction in pressure. In the former case, a switching valve 11 is employed, but is not employed in the latter case.

Following is a description of a case in which a switching valve 11 is employed.

When switching valve 11 is opened to create negative pressure in cooling trap 6, the gas in cooling trap 6 flows through switching valve 11 to cooling trap 5 and is frozen and collected in said cooling trap 5 again. Switching valve 11 may simply perform a switching function, or fixed or variable orifices may be provided upstream and downstream of said switching valve 11 as required, or there may be provided aperture-variable orifices or aperture-variable switching valves associated with the trap temperature at the side of cooling trap 5, pressure sensor 13 or halogen detectors 15, 17. In this case there is simply used a switching valve 11. The timing of closing of switching valve 11 is determined from an internal pressure in cooling trap 6 by pressure sensor 14.

To stop operation of cooling trap 5 to thereby regenerate the collected mixed gas, switching valve 18' is opened by the same procedure as described above in relation to switching valve 18 to connect cooling trap 5 and non-PFC gas removal system 19.

In order to examine the amount of gas discharged from etching chamber 1 and frozen and collected at cooling trap 5 on a cooling side in the PFC gas recovery apparatus having the above structure, the amount of emission gas is measured at points A and B in FIG. 2. The measurement results are shown in FIG. 3. The difference between gas flow rates (sccm) at A and B represents the amount of gas collected at cooling trap 5, and the proportion of the gas frozen and collected to the gas entering cooling trap 5 is shown as "trap efficiency (%)".

Figure 1:
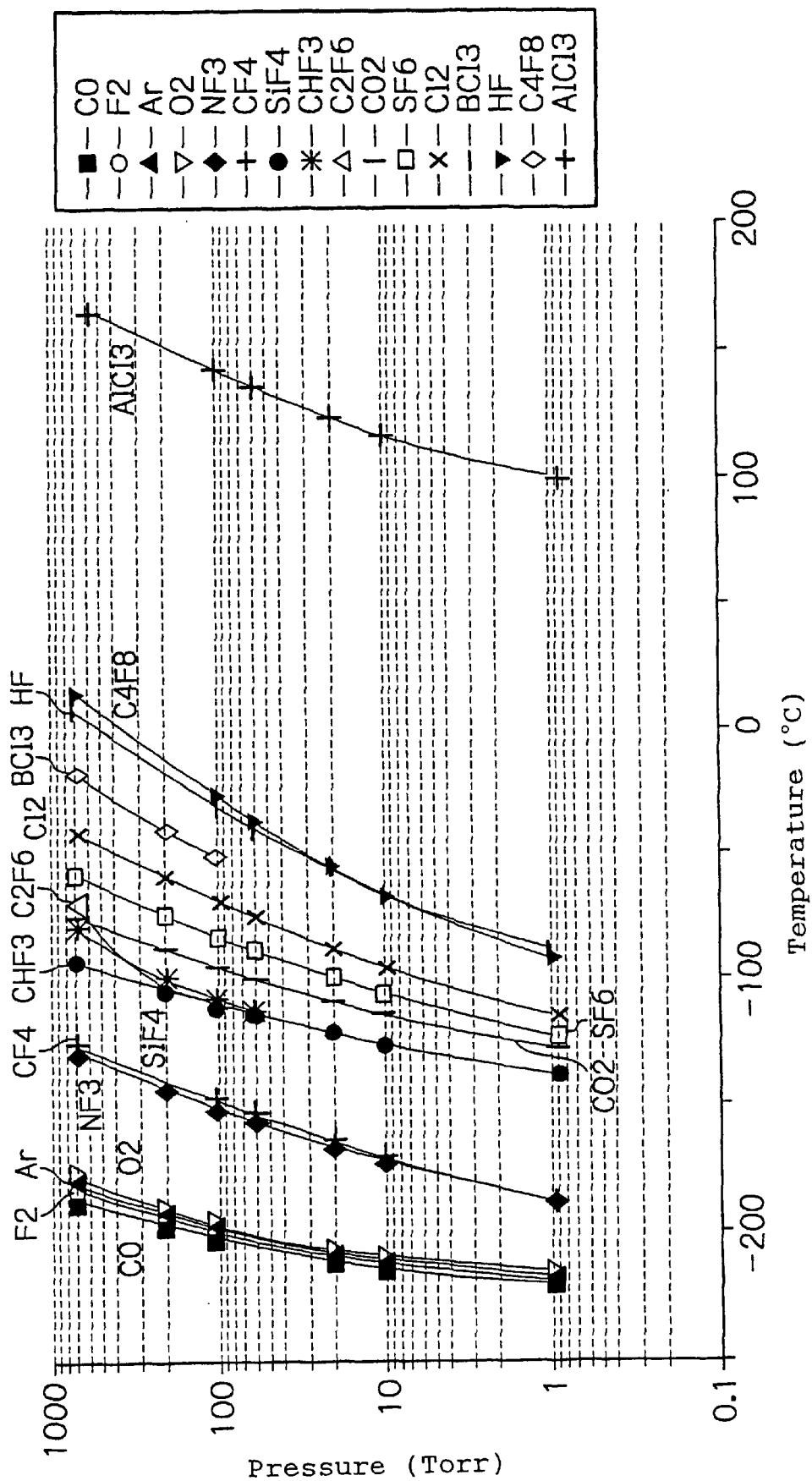
FIG. 1 shows vaporization curves of various gases.

As shown in FIG. 3, a PFC gas $CF_4$ is frozen and collected at a high trap efficiency of 95%, and non-PFC gases having a vapor pressure temperature higher than that of $CF_4$ such as $CO_2$, $SiF_4$ and HF (see FIG. 1) are frozen and collected at high trap efficiencies of 85%, 90% and 98%, respectively. The trap efficiencies of CO, $F_2$ and $O_2$ having a vapor pressure temperature lower than that of $CF_4$ are as low as 4%, 10% and 3%, respectively.

Hazardous reactive gases are removed at toxic gas removal system 3, as determined from gas flow rates (sccm), (concentration in ppm) at point C in FIG. 2. FIG. 3 shows gas flow rates (sccm), (ppm concentration) at point C. As shown from FIG. 3, hazardous gases such as $SiF_4$, $F_2$, HF have been removed at toxic gas removal system 3. The flow rate of diluting $N_2$ here is 1800 sccm. The PFC gas content in gases at point C is as low as about 160 ppm and thus may be directly exhausted to the atmosphere.

The nature of the gas discharged from cooling trap 6 on a regeneration side is ascertained by determination at D in FIG. 2. The results are shown in FIG. 4. As shown in FIG. 4, the discharged gas contains $CF_4$ as a PFC gas and CO, $CO_2$, $SiF_4$, $F_2$, HF and $O_2$ as non-PFC gases. When 25 wafers of 8 inches (diameter 200 mm) were treated in an etching chamber, the amounts of gas components trapped were $CF_4$=2700, CO=20, $CO_2$=2100, $SiF_4$=216, $F_2$=67, HF=940 and $O_2$=5 (ml), and the gas flow at E in FIG. 2 after having passed non-PFC gas removal system 19 showed $CF_4$=2700 (ml) in contrast to zero for other gases. This means that essentially 100% of $CF_4$ frozen and collected at cooling trap 6 could be recovered.

Figure 5:
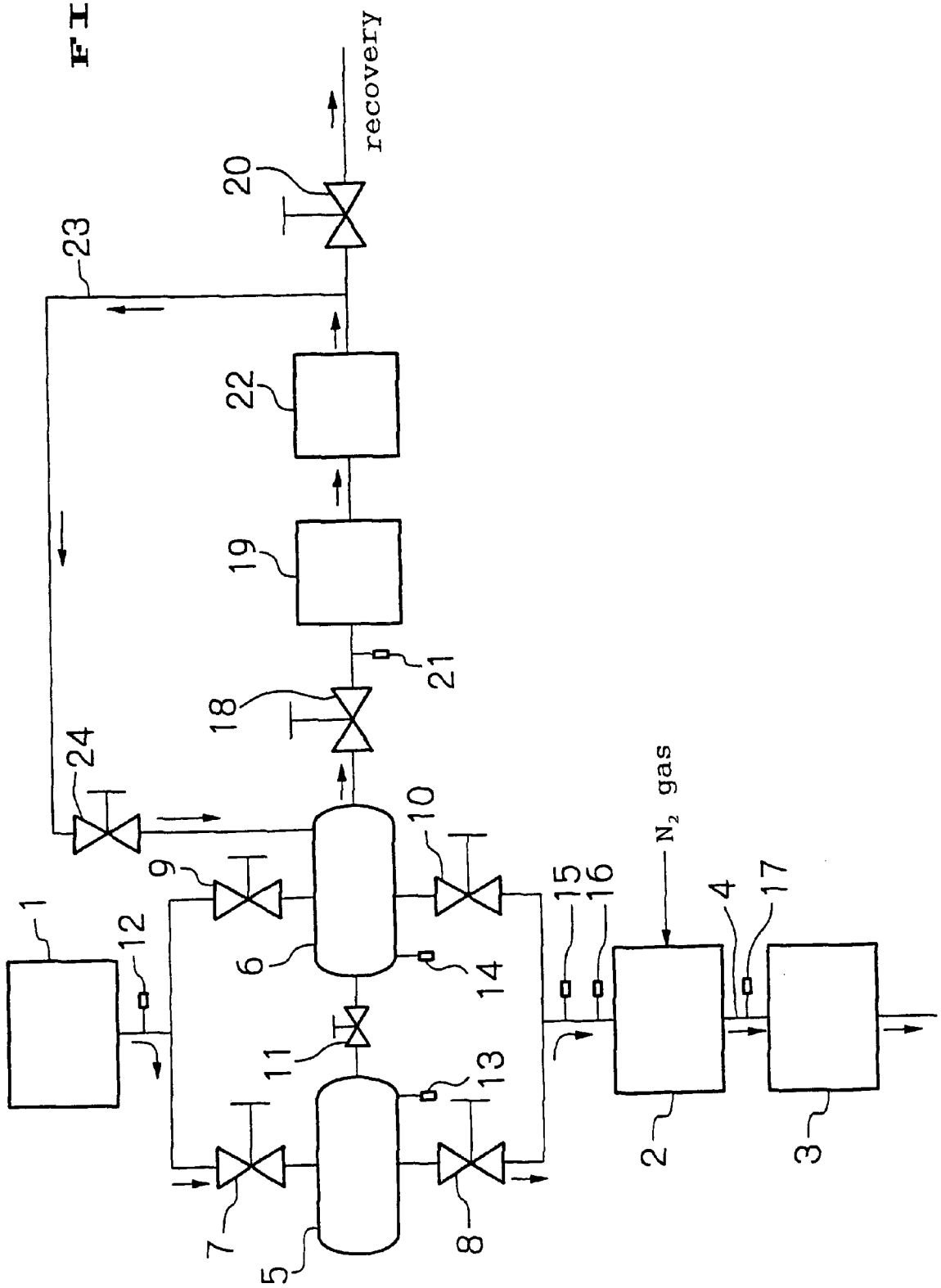
FIG. 5 shows an arrangement of a PFC gas recovery apparatus according to another embodiment of the present invention.

FIG. 5 shows an arrangement of a PFC gas recovery apparatus according to Claim 3. Here, compressor 22 is provided after non-PFC gas removal system 19, and first circulation loop 23 is provided for connecting the discharge side of said compressor 22 and cooling trap 6 via switching valve 24. Thus, compressor 22 is provided to force the high-concentration PFC gas exiting non-PFC gas removal system 19 to the recovery side (purification side) during recovery when switching valve 20 is opened. During regeneration, first circulation loop 23 opens switching valve 24 to transfer the high-concentration PFC gas to cooling trap 6 on a regeneration side. Thus, the regenerated gas in cooling trap 6 can be rapidly transferred to non-PFC gas removal system 19. Although compressor 22 is provided after non-PFC gas removal system 19 to smooth the supply of the returning gas by raising the pressure of the high-concentration PFC gas to be returned to cooling trap 6 above the pressure in the cooling trap in the embodiment shown in FIG. 5, such a step may not be required. In place of the compressor provided after the non-PFC gas removal system in this manner, any suitable pressure control means known to those skilled in the art can be provided in return piping 23 to smooth gas flow returned to cooling trap 6. This may also apply to other embodiments of the present invention described below.

In the PFC gas recovery apparatuses according to the embodiments shown in FIG. 5 and FIGS. 6 to 9 described below, cooling trap 5 on cooling operation side is also connected to a regeneration line consisting of non-PFC gas removal system 19 or the like via switching valves similarly to cooling trap 6 and in the same manner as the apparatus shown in FIG. 2, and the cooling operation of cooling trap 5 is stopped to regenerate the collected gas by operating these switching valves to connect cooling trap 5 with a regeneration line consisting of non-PFC gas removal system 19 or the like so as to accomplish regeneration of the collected gas, removal of non-PFC gases and concentration and recovery of a PFC gas, though connection between cooling trap 5 and the regeneration line is omitted in FIGS. 5 to 9 for the sake of simplicity.

Figure 6:
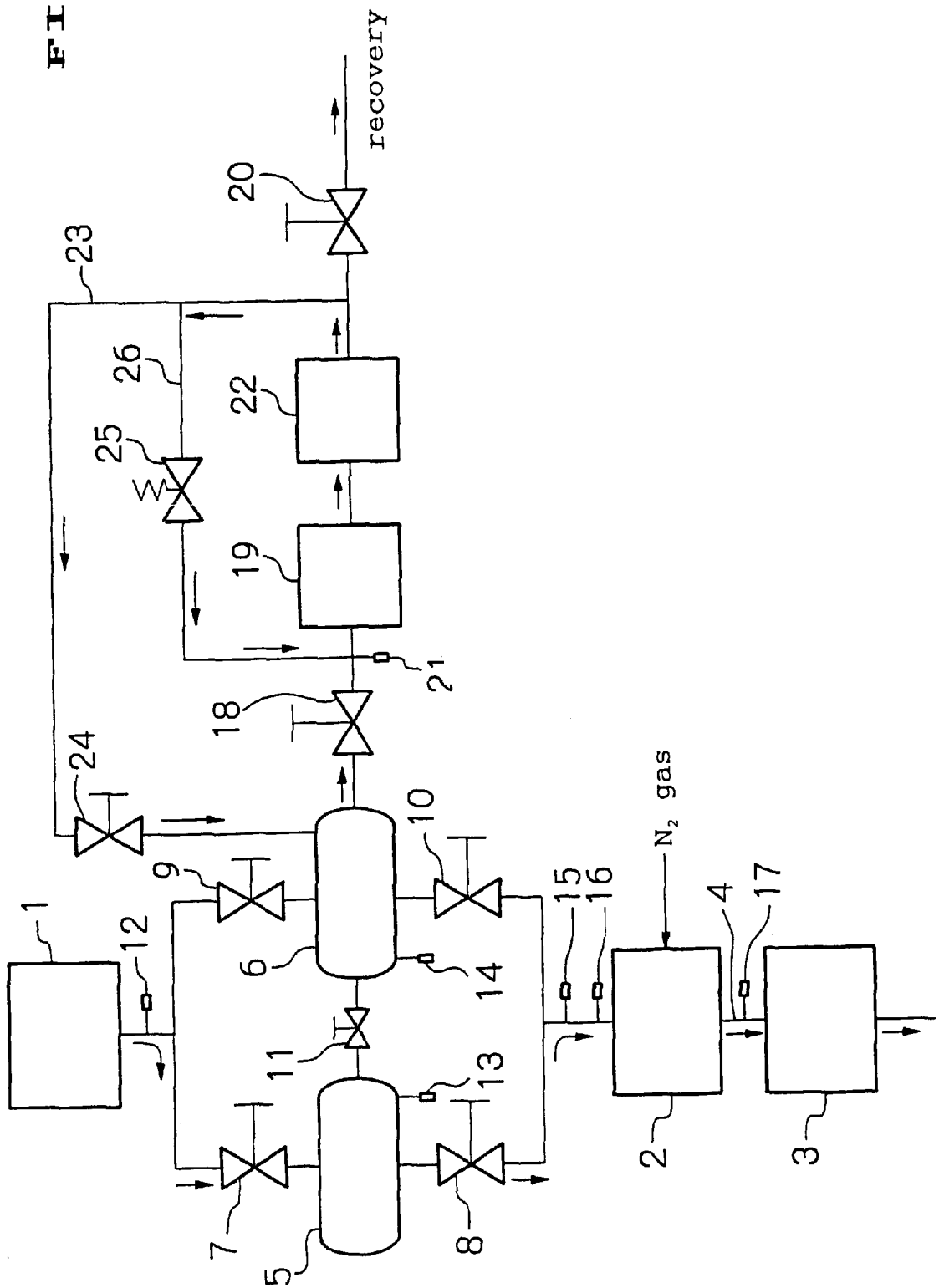
FIG. 6 shows an arrangement of a PFC gas recovery apparatus according to another embodiment of the present invention.

FIG. 6 shows an arrangement of a PFC gas removal apparatus according to another embodiment of the present invention as defined in claim 4. Here is provided a second circulation loop 26 for connecting the discharge side of compressor 22 and the inlet side of non-PFC gas removal system 19 via constant flow control valve 25. Said second circulation loop is provided to always circulate gas to avoid entrapment which has a negative effect on compressor 22. Thus, a vacuum can be rapidly drawn in cooling trap 6.

Figure 7:
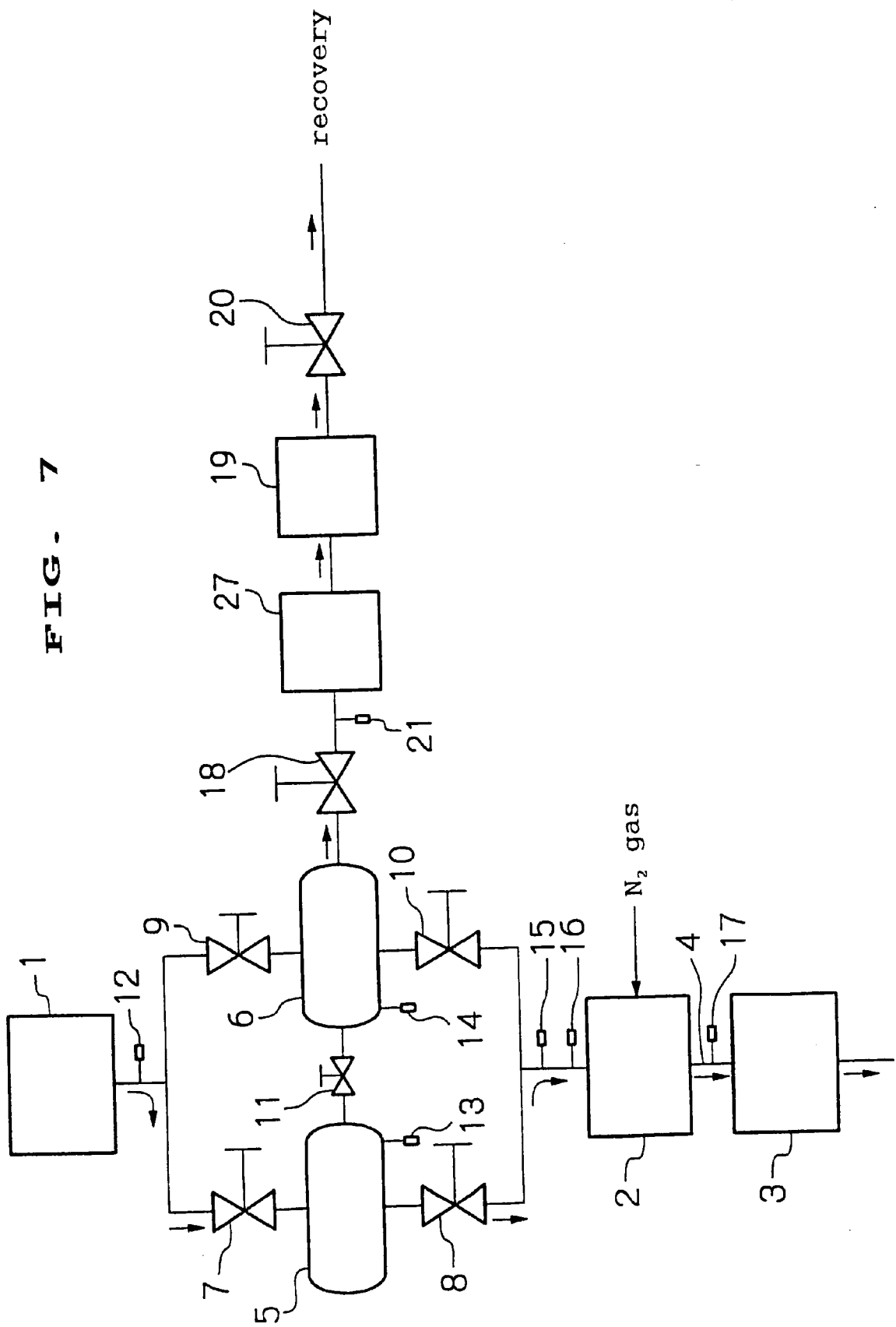
FIG. 7 shows an arrangement of a PFC gas recovery apparatus according to another embodiment of the present invention.

FIG. 7 shows an arrangement of a PFC gas recovery apparatus according to another embodiment of the present invention as defined in claim 5. Here is provided vacuum pump 27 on the inlet side of non-PFC gas removal system 19. Vacuum pump 27 is preferably a dry pump. When a vacuum pump is provided on the inlet side of the non-PFC gas removal system in this manner, the pressure on the side of the non-PFC gas removal system can be reduced, whereby a regeneration operation of cooling trap 6 can be performed under reduced pressure and the regeneration temperature of cooling trap 6 can be kept low. Therefore, water vapor is unable to enter the regenerated gas when the temperature is raised to around room temperature during regeneration of the cooling trap, and the energy required to cool cooling trap 6 to a predetermined cooling temperature can be saved when it is returned to cooling operation after completion of regeneration because cooling trap 6 is kept at low temperature even during the regeneration step. Vacuum pump 27 can also be used to rapidly evacuate cooling trap 6 for returning to a cooling operation after completion of regeneration in cooling trap 6.

Figure 8:
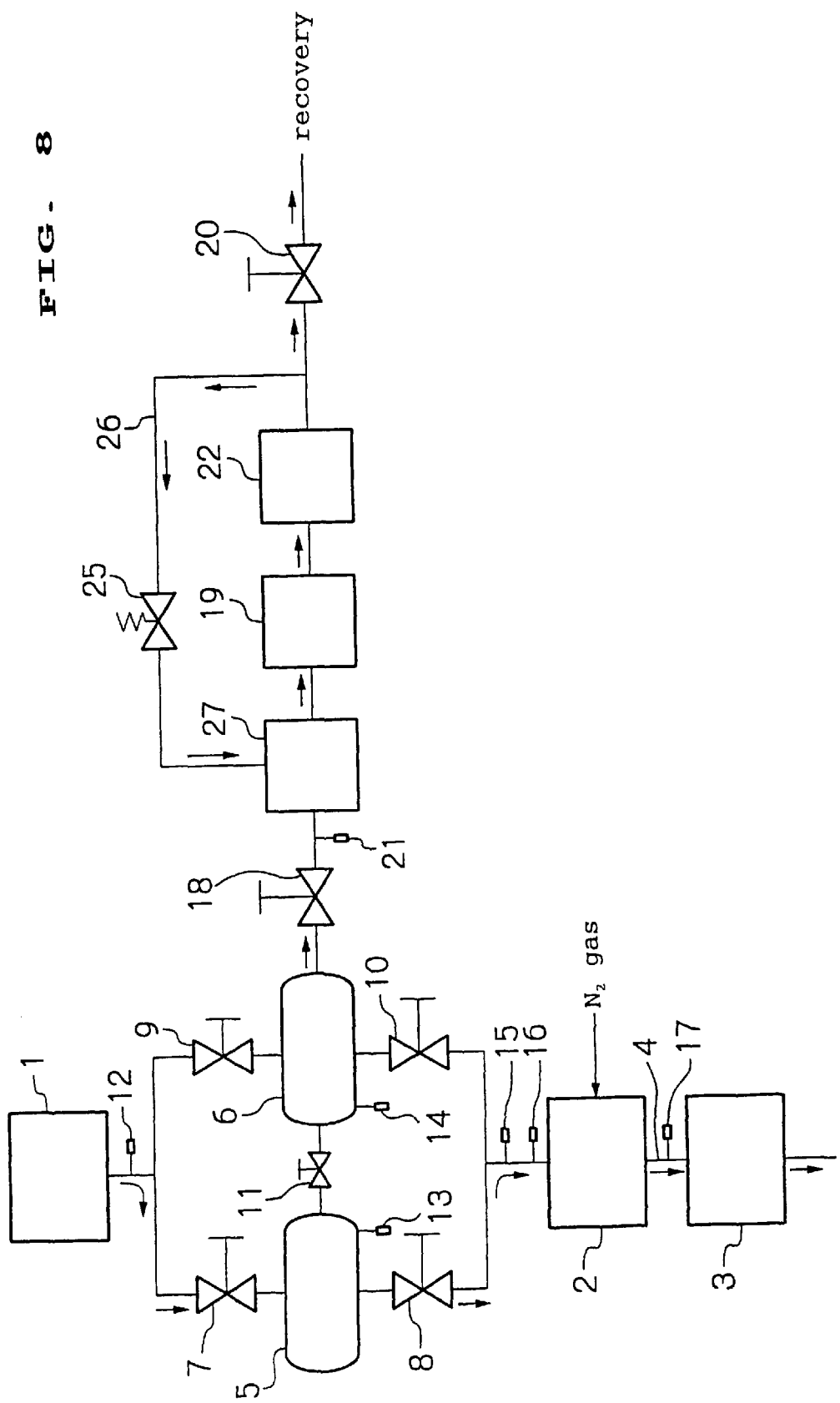
FIG. 8 shows an arrangement of a PFC gas recovery apparatus according to another embodiment of the present invention.

FIG. 8 shows an arrangement of a PFC gas recovery apparatus according to another embodiment of the present invention as defined in claim 6. In this embodiment, a part of the high-concentration PFC gas discharged from non-PFC gas removal system 19 of the PFC gas recovery apparatus shown in FIG. 7 is supplied to dry pump 27 as a gas for oil diffusion prevention and dilution in the dry pump. In the embodiment shown in FIG. 8, compressor 22 is provided after non-PFC gas removal system 19 to supply the high-concentration PFC gas discharged from compressor 22 as a gas for oil diffusion prevention and dilution in dry pump 27 via circulation loop 26 and constant flow control valve 25. This compressor 22 may, as needs dictate, be replaced with some other pressure control means, as explained above. When a part of the high-concentration PFC gas is supplied to dry pump 27 as a gas for oil diffusion prevention and dilution as shown in FIG. 8, the regenerated PFC gas can be sent to a non-PFC gas removal system without dilution. However, this arrangement is not necessary when the dry pump used does not require any gas for oil diffusion prevention and dilution. When the recovered PFC gas is used for the application that is not influenced by inclusion of nitrogen, a part of the high-concentration PFC gas may not be circulated but instead, $N_2$ gas may be externally supplied as a gas for oil diffusion prevention and dilution to the dry pump.

Figure 9:
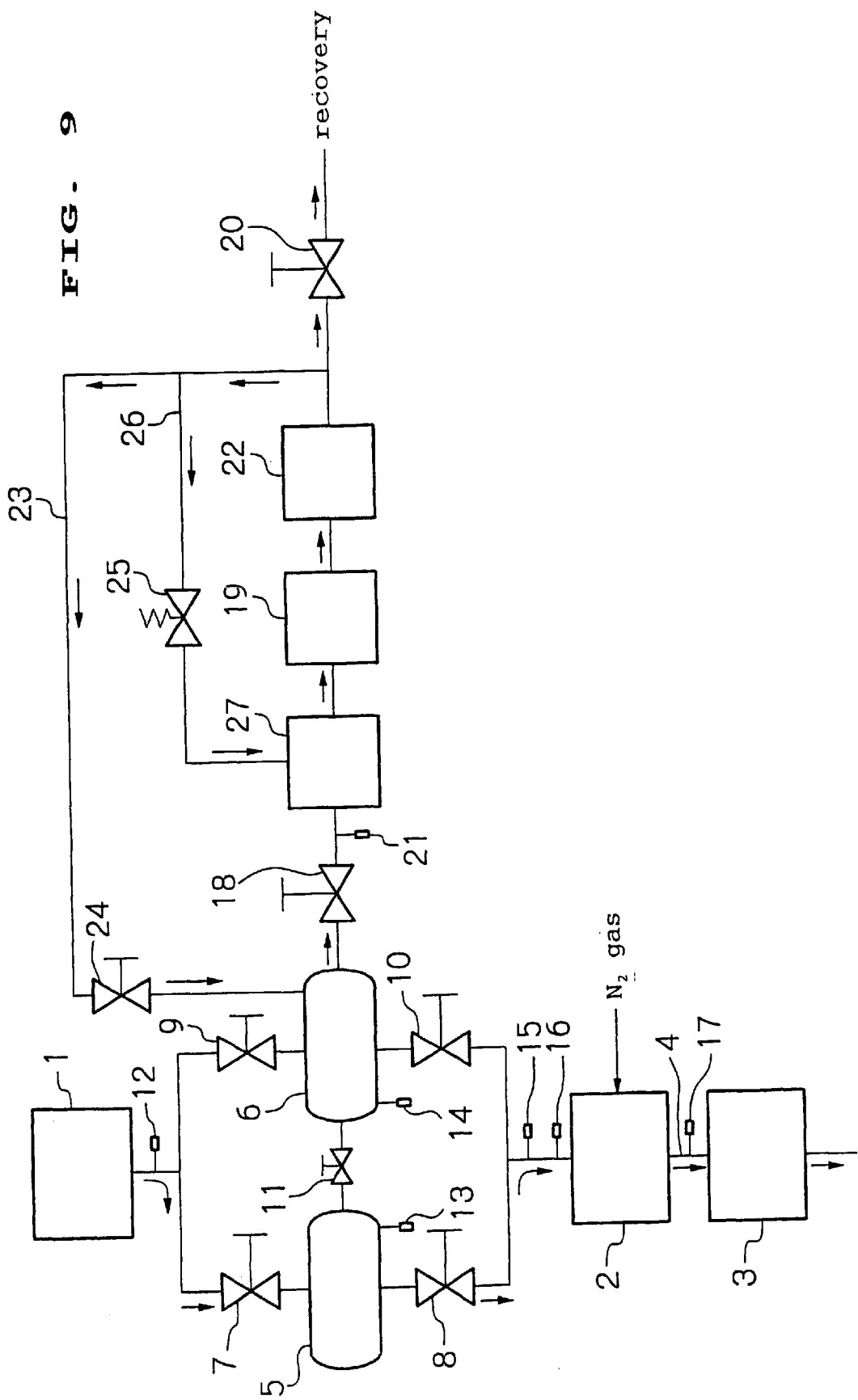
FIG. 9 shows an arrangement of a PFC gas recovery apparatus according to another embodiment of the present invention.

The apparatuses according to the embodiments shown in FIGS. 7 and 8 may also be designed to circulate a part of the high-concentration PFC gas discharged from the non-PFC gas removal system to cooling trap 6 similarly to the embodiment shown in FIG. 5. As a specific example thereof, FIG. 9 shows a PFC gas recovery apparatus comprising a first circulation loop for circulating a part of the high-concentration PFC gas discharged from the non-PFC gas removal system to cooling trap 6 and a second circulation loop for supplying another part to the dry pump.

In the PFC gas recovery apparatus having the above structure, the refrigerator used for cooling traps 5, 6 should be capable of cooling to a temperature at which all the target PFC gases to be recovered condense. Among target PFC gases to be recovered, $CF_4$ has the lowest temperature-vapor pressure curve as shown in vapor pressure diagrams. It is desirable to use a cooler capable of ensuring a temperature of about −230° C. when gases such as $CO_2$ or Ar are included, though simple $CF_4$ gas has a condensation temperature of about −200° C. at the order of 0.1 Torr.

A simple means which can be employed to ensure said low temperature is the use of a small-size, low temperature refrigerator employing GM cycles, Solvay cycles, Sterling cycles, JT valve cycles or the like, or the use of liquid nitrogen.

However, not all species of PFC gases can be collected by the use of liquid nitrogen because liquid nitrogen has a boiling point of −196° C. which is lower than said temperature of −200° C. or −230° C. Employing liquid nitrogen is not always a simple means because bulky equipment is required for the supply of liquid nitrogen in large-scale manufacturing facilities, as opposed to the small-scale use in laboratories and so on.

On the other hand, a small-size, low temperature refrigerator employing GM cycles, Solvay cycles, Sterling cycles, JT valve cycles or the like is a cryogenic refrigerator using helium as a coolant and having a compact and powerful compressor and a low temperature refrigerator part. A single-stage GM cycle refrigerator is used here.

The purpose of non-PFC gas removal system 19 is to remove non-PFC gases from the gas regenerated in cooling trap 6 on a regeneration side to give a high-concentration PFC gas. The design of non-PFC gas removal system 19 will be readily appreciated by those skilled in the art, depending on the non-PEC gases to be removed varying with the demands in the application of the recovered gas. An example is described below for the case where the following three categories of gas are removed:

1) Acid gases: $SiF_4$, $F_2$, HF, $CO_2$, etc.
2) Reducing gases: CO, etc.
3) Combustion-supporting gases: $O_2$, etc.

FIG. 10 shows an arrangement of non-PFC gas removal system 19. Non-PFC gas removal system 19 has first cylinder 19-1 and second cylinder 19-2 as shown in FIG. 10. First cylinder 19-1 and second cylinder 19-2 are connected via switching valve 19-3, and switching valve 19-4 is connected to the discharge port of second cylinder 19-2.

First cylinder 19-1 contains an alkaline agent 19-1a for neutralizing said acid gases, moisture adsorbent 19-1b for adsorbing $H_2O$, metal oxidant 19-1c for converting CO into $CO_2$ and alkaline agent 19-1d for neutralizing $CO_2$. Second cylinder 19-2 contains deoxygenating agent 19-2a for removing $O_2$.

The gas regenerated in cooling trap 6 on a regeneration side and discharged is a mixed gas of $CF_4$, $O_2$, $SiF_4$, $F_2$, $CO_2$, CO, HF, from which other gases than $O_2$, i.e. $SiF_4$, $F_2$, $CO_2$, CO, HF or the like are removed in first cylinder 19-1. The mixed gas discharged from first cylinder 19-1 is freed of $O_2$ in second cylinder 19-2, and the remaining $CF_4$ gas is discharged from second cylinder 19-2. After $O_2$ is adsorbed to saturation in second cylinder 19-2, only said second cylinder 19-2 is removed (or switching valves 19-3 and 19-4 are closed) and $O_2$ is redischarged by introduction of $H_2$ and heating by a heater so that deoxygenating agent 19-2a can be recycled.

As described above, the design of the non-PFC gas removal system varies with the nature of the non-PFC gas to be removed in the application of the recovered gas. If the recovered PFC gas is used in applications that are not influenced by inclusion of $O_2$ (i.e. not influenced by inclusion of $O_2$ in the recovered PFC gas), for example, said deoxygenating agent 19-2a is unnecessary.

A toxic gas removal system 3 used to remove reactive hazardous gases from the gas discharged from cooling trap 5 in a cooling operation may have a similar structure to that of non-PFC gas removal system 19 described above.

Although recovery of $CF_4$ as a representative example of PFC gases has been described in the foregoing examples, the present invention is also applicable to regeneration and recovery of other PFC gases such as $C_2F_6$, $C_3F_8$, $C_2F_4$, $CHF_3$, $C_4F_8$. The present invention is also applicable to recovery of a PFC gas from a mixed gas of the PFC gas and non-PFC gases such as $SiF_4$, $F_2$, $CO_2$, Ar and HF discharged from a vacuum processing chamber during semiconductor manufacturing processes, by appropriately selecting chemicals used in the non-PFC gas removal system, so that the mixed gas is frozen and collected in a cooling trap and the PFC gas is recovered from the regenerated mixed gas emitted by vaporization of the frozen and collected gas.

INDUSTRIAL APPLICABILITY

As will be apparent from the foregoing description, the present invention provides the following highly advantageous effects.

In accordance with the present invention, a PFC gas recovery process can be provided, comprising regenerating a mixed gas frozen and collected at high trap efficiency in a cooling trap and removing non-PFC gases from said regenerated mixed gas in a non-PFC gas removal system to give a high-concentration PFC gas, after which said high-concentration PFC gas can be recovered at a high efficiency.

Also according to the present invention, a PFC gas recovery apparatus can be provided, comprising a cooling trap connected to the exhaust system of a vacuum processing chamber and adapted to freeze and collect a mixed gas discharged from said vacuum processing chamber, and a non-PFC gas removal system for removing non-PFC gases from the. regenerated mixed gas emitted by vaporization of said frozen and collected gas after the operation of said cooling trap is stopped to recover a high-concentration PFC gas freed of non-PFC gases in said non-PFC gas removal system, whereby said high-concentration PFC gas can be recovered with high efficiency.

According to another embodiment of the present invention, a PFC gas recovery apparatus comprising two cooling traps can be provided, wherein a mixed gas containing a PFC gas discharged from a vacuum processing chamber is frozen and collected at one cooling trap while the operation of the other cooling trap is stopped to recover the PFC gas from the mixed gas emitted by vaporization of the frozen and collected gas, whereby the PFC gas can be recovered without interrupting the process in the vacuum processing chamber.

What is claimed is:

1. An apparatus for recovering a PFC gas from a mixed gas containing the PFC gas discharged from a vacuum processing chamber, comprising a plurality of cooling traps connected to an exhaust system of the vacuum processing chamber and adapted to freeze and collect the mixed gas discharged from said vacuum processing chamber, a non-PFC gas removal system for removing gases other than the PFC gas from the regenerated mixed gas emitted by vaporization of frozen and collected gas after the operation of one of said cooling traps is stopped, and a recovery means for recovering a high-concentration PFC gas freed of gases other than the PFC gas in said non-PFC gas removal system, said apparatus comprising two cooling traps wherein a mixed gas containing the PFC gas discharged from the vacuum processing chamber is frozen and collected at one cooling trap while the operation of the other cooling trap is stopped to recover the PFC gas from the regenerated mixed gas emitted by vaporization of said frozen and collected gas.

2. The apparatus for recovering a PFC gas according to claim 1, which comprises a first circulation loop for supplying the high-concentration PFC gas discharged from said non-PFC gas removal system to said recovery means and returning a part of said high-concentration PFC gas to said cooling trap, whereby a part of said high-concentration PFC gas is supplied to said cooling trap via said first circulation loop.

3. The apparatus for recovering a PFC gas according to claim 2, which comprises a second circulation loop for returning a part of the high-concentration PFC gas discharged from said non-PFC gas removal system to the inlet side of said non-PFC gas removal system to constantly supply the high-concentration gas to said non-PFC gas removal system via said second circulation loop.

4. The apparatus for recovering a PFC gas according claim 1, which comprises a vacuum pump on the inlet side of said non-PFC gas removal system.

5. The apparatus for recovering a PFC gas according to claim 4, which comprises a circulation loop for supplying a part of the high-concentration PFC gas discharged from said non-PFC gas removal system as a gas for oil diffusion prevention and dilution to said vacuum pump.

6. The apparatus for recovering a PFC gas according to claim 4 or 5, which comprises a circulation loop for returning a part of the high-concentration PFC gas discharged from said non-PFC gas removal system to said recovery means, whereby a part of said high-concentration PFC gas is supplied to said cooling trap via said circulation loop.

* * * * *